(12) United States Patent
Bulumulla et al.

(10) Patent No.: US 9,678,183 B2
(45) Date of Patent: Jun. 13, 2017

(54) WIRELESS ACTUATOR CIRCUIT FOR WIRELESS ACTUATION OF MICRO ELECTROMECHANICAL SYSTEM SWITCH FOR MAGNETIC RESONANCE IMAGING

(71) Applicant: General Electric Company, Schenectady, NY (US)

(72) Inventors: Selaka Bandara Bulumulla, Niskayuna, NY (US); Joseph Alfred Iannotti, Niskayuna, NY (US); Steven William Wik, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 525 days.

(21) Appl. No.: 14/459,352

(22) Filed: Aug. 14, 2014

(65) Prior Publication Data

US 2016/0047869 A1    Feb. 18, 2016

(51) Int. Cl.
  *G01R 33/36*   (2006.01)
  *H01H 9/54*    (2006.01)

(52) U.S. Cl.
  CPC ..... *G01R 33/3692* (2013.01); *G01R 33/3657* (2013.01); *H01H 9/54* (2013.01)

(58) Field of Classification Search
  CPC .......................... G01R 33/3692; G01R 33/3657
  See application file for complete search history.

(56) References Cited

U.S. PATENT DOCUMENTS

| | | | |
|---|---|---|---|
| 6,404,703 B1* | 6/2002 | Burrell | G01S 1/74 367/127 |
| 6,933,655 B2 | 8/2005 | Morrison et al. | |
| 7,531,002 B2 | 5/2009 | Sutton et al. | |
| 8,436,614 B2* | 5/2013 | Biber | G01R 33/281 324/318 |
| 8,452,356 B2 | 5/2013 | Vestel et al. | |
| 2005/0055244 A1 | 3/2005 | Mullan et al. | |
| 2008/0281212 A1 | 11/2008 | Nunez et al. | |
| 2009/0054793 A1 | 2/2009 | Nunez et al. | |
| 2010/0274101 A1 | 10/2010 | Lin et al. | |

(Continued)

OTHER PUBLICATIONS

Sheybani et al., "High efficiency wireless electrochemical actuators: Design, fabrication and characterization by electrochemical impedance spectroscopy", Micro Electra Mechanical Systems (MEMS), 2011 IEEE 24th International Conference on, pp. 1233-1236, Jan. 2011.

*Primary Examiner* — Gregory H Curran
(74) *Attorney, Agent, or Firm* — Pabitra K. Chakrabarti

(57) ABSTRACT

A wireless actuator circuit configured to actuate a micro electromechanical system (MEMS) switch is provided. The wireless actuator circuit includes a transmitter portion and a receiver portion operatively coupled to the transmitter portion. The transmitter portion includes an oscillator device configured to generate a signal at a determined frequency and a first antenna operatively coupled to the oscillator device to receive a modulated signal. Further, the receiver portion includes a second antenna configured to receive the modulated signal from the transmitter portion, a radio frequency power detector configured to detect the modulated signal and a comparator configured to produce a control signal in response to the modulated signal detected by the radio frequency power detector to toggle the MEMS switch.

23 Claims, 6 Drawing Sheets

(56) References Cited

U.S. PATENT DOCUMENTS

2011/0077476 A1    3/2011    Rofougaran
2013/0134018 A1    5/2013    Aimi
2014/0067003 A1    3/2014    Vase et al.

* cited by examiner

WIRELESS ACTUATOR CIRCUIT FOR WIRELESS ACTUATION OF MICRO ELECTROMECHANICAL SYSTEM SWITCH FOR MAGNETIC RESONANCE IMAGING

BACKGROUND

Embodiments of the present specification relate to magnetic resonance imaging (MRI), and more particularly to wireless actuation of MRI coils.

As will be appreciated, when a substance such as human tissue is subjected to a uniform magnetic field (polarizing field $B_0$), individual magnetic moments of spins in tissues attempt to align with the applied polarizing field. However, the individual magnetic moments of the spins precess about this polarizing field in random order at their characteristic Larmor frequency. If the substance or tissue is subjected to a magnetic field (excitation field $B_1$) which is in the x-y plane and the magnetic field is near the Larmor frequency, the net aligned moment, or "longitudinal magnetization", $M_Z$, may be rotated, or "tipped," into the x-y plane to produce a net transverse magnetic moment, $M_t$. Further, a signal is emitted by excited spins after the excitation field, $B_1$, is terminated. This emitted signal may be acquired and processed to form an image.

Moreover, when utilizing these emitted signals to produce images, magnetic field gradients (Gx, Gy, and Gz) are employed. Typically, a region of interest that is to be imaged is scanned by a sequence of measurement cycles in which these magnetic field gradients vary based on a particular localization method being used. Resulting sets of received nuclear magnetic resonance (NMR) signals are digitized and processed to reconstruct an image using known image reconstruction techniques.

Over time, magnetic resonance (MR) systems have progressed from low-field, single-channel systems toward high-field multi-channel systems, allowing highly accelerated parallel imaging. A number of channels in MR scanners has been increasing rapidly, resulting in a large number of cables running from the system to MRI coils. The increasing number of cables leads to longer patient set up time as well as patient discomfort during imaging as these MRI coils are placed around the patient. Therefore, there is an ongoing effort to enable one or more aspects of an MR system to be wireless.

BRIEF DESCRIPTION

In accordance with aspects of the present specification, a wireless actuator circuit configured to actuate a micro electromechanical system (MEMS) switch is provided. The wireless actuator circuit includes a transmitter portion and a receiver portion operatively coupled to the transmitter portion. The transmitter portion includes an oscillator device configured to generate a signal at a determined frequency and a first antenna operatively coupled to the oscillator device and configured to receive a modulated signal. Further, the receiver portion includes a second antenna configured to receive the modulated signal from the transmitter portion, a radio frequency power detector configured to detect the modulated signal and a comparator configured to produce a control signal in response to the modulated signal detected by the radio frequency power detector to toggle the MEMS switch.

In accordance with another aspect of the present specification, a magnetic resonance imaging system includes one or more receiver coils, a MEMS switch operatively coupled to the one or more receiver coils and a wireless actuator circuit configured to actuate the MEMS switch. The wireless actuator circuit includes a transmitter portion and a receiver portion operatively coupled to the transmitter portion. The transmitter portion includes a voltage controlled oscillator configured to generate a signal at a determined frequency. Further, the transmitter portion includes a radio frequency switch operatively coupled to the voltage controlled oscillator, where the radio frequency switch is configured to receive the signal from the voltage controlled oscillator, and where the radio frequency switch is configured to convert the signal received from the voltage controlled oscillator into a modulated signal. Additionally, the transmitter portion includes a first antenna operatively coupled to the radio frequency switch, where the first antenna is configured to receive the modulated signal from the radio frequency switch. Further, the receiver portion of the wireless actuator circuit includes a second antenna configured to receive the modulated signal from the transmitter portion. Also, the receiver portion includes a radio frequency power detector configured to detect the modulated signal and a comparator configured to produce a control signal in response to the modulated signal detected by the radio frequency power detector to toggle the MEMS switch.

In accordance with yet another aspect of the present specification, a method for imaging a subject of interest is provided. The method includes providing a MEMS switch and providing a wireless actuator circuit. The method further includes providing receiver coils operatively coupled to the MEMS switch and wirelessly actuating the MEMS switch to disable the receiver coils. Further, the method includes producing a magnetic field, generating radio frequency excitation pulses, or both using transmitter coils and wirelessly actuating the MEMS switch to enable the receiver coils. Moreover, the method includes detecting emissions from gyromagnetic material within the subject of interest in response to the radio frequency excitation pulses using the receiver coils.

DRAWINGS

These and other features, aspects, and advantages of the present disclosure will become better understood when the following detailed description is read with reference to the accompanying drawings in which like characters represent like parts throughout the drawings, wherein.

Figure 6A:
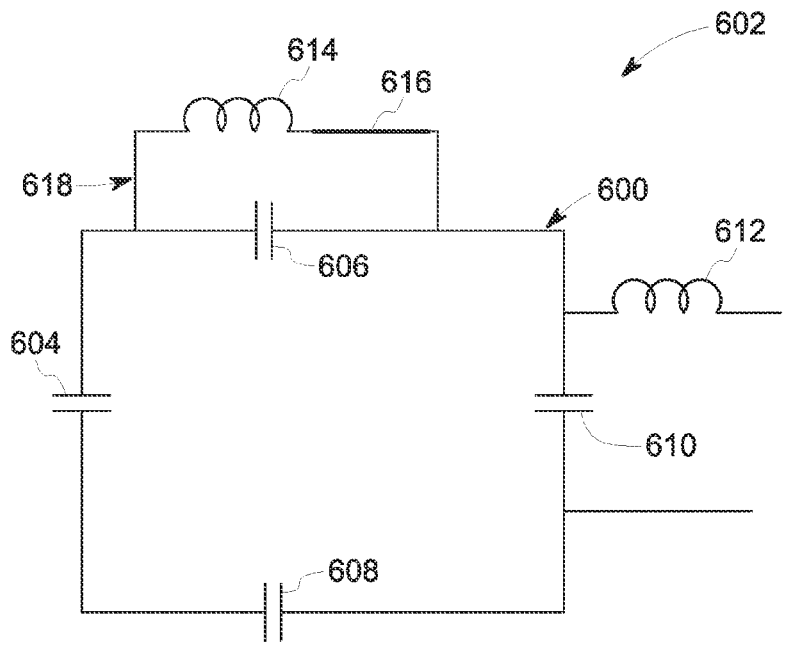
Figure 6B:
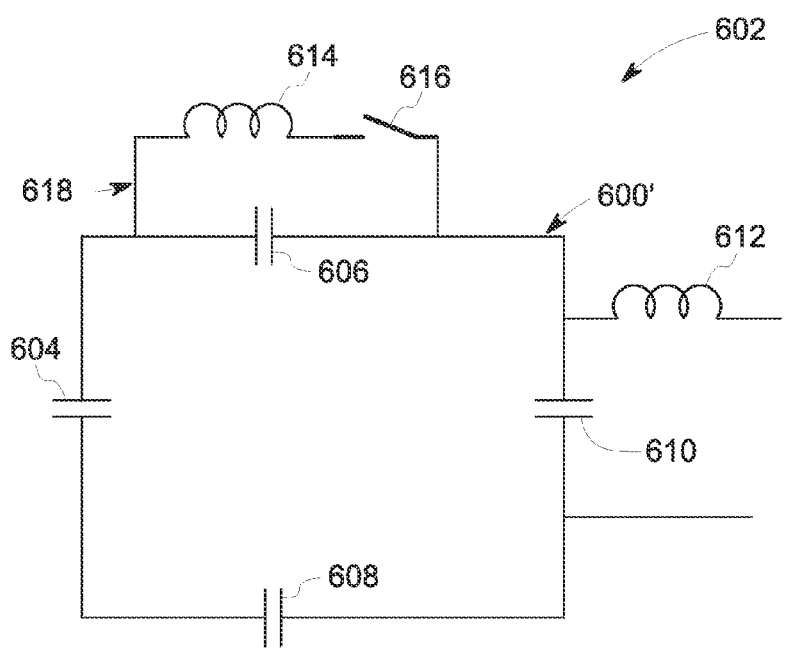
Figure 7:
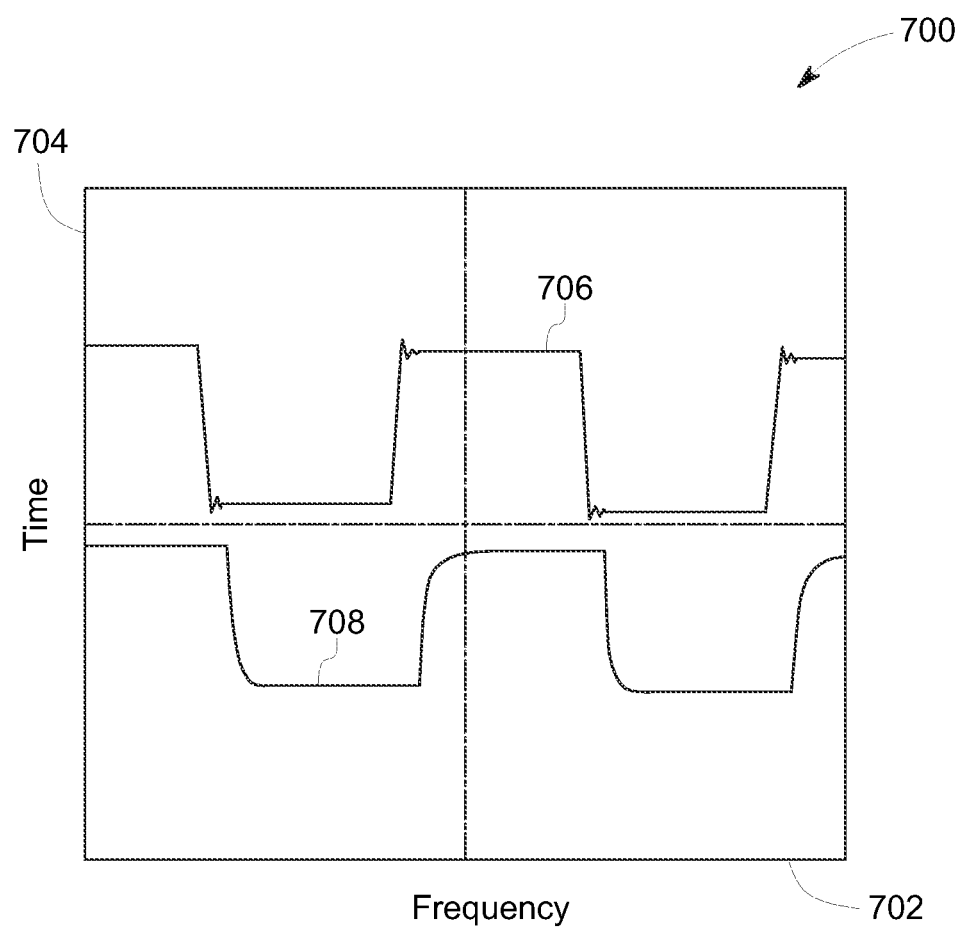

FIGS. 6A-6B are schematic representations of an exemplary circuit diagram for physical placement of a MEMS switch in a receiver coil having a de-tuning circuit, in accordance with aspects of the present specification; and FIG. 7 is a graphical representation of an input and a resultant output of a comparator employed in a wireless actuator circuit, in accordance with aspects of the present specification.

DETAILED DESCRIPTION

Embodiments of the present specification relate to systems and methods for wireless actuation of a micro electromechanical system (MEMS) switch for magnetic resonance imaging (MRI). Typically, a MRI system employs a switch to enable and/or disable receiver coils of the MRI system during image acquisition. By way of example, the receiver coils are disabled during a transmitting mode of the MRI system, and enabled during a receiving mode of the MRI system. Generally, the switch is configured to be actuated using wired connections. Some of the existing MRI systems employ a MEMS switch instead of a pin diode to enhance switching speed of the switch configured to enable and/or disable the receiver coils in the MRI system. Further, sometimes, a low power MEMS switch is used to facilitate high speed switching of the receiver coils. However, with a wired implementation of the MEMS switch, switching latencies of the MEMS switch are relatively high. Further, these switching latencies at least partly offset advantages provided by a low power MEMS switch. As used here, the term "switching latencies" may entail rise and fall times of emission from the coils of the MRI system.

In some embodiments, a wirelessly actuated MEMS switch is used to enable and/or disable receiver coils in a MRI system. In certain embodiments, systems and methods of the present specification are configured to provide a wireless actuator circuit for wireless actuation of the MEMS switch. Advantageously, embodiments of the present specification provide a wireless actuator circuit configured to actuate the MEMS switch with low switching latencies. In some embodiments, the MEMS switch is a low power switch. Further, wireless actuation of the MEMS switch circumvents complications otherwise associated with the switching latencies in case of the wired actuation of the MEMS switch. Moreover, when the wireless actuation of the MEMS switch is used in the MRI system, benefits of using the low power MEMS switch are manifested in the functioning of the MRI system.

In some embodiments, the MEMS switch may include a substrate and an actuator having a first side and a second side. Further, the substrate is coupled to the second side of the actuator. The actuator may be configured to transition from a conducting state to a non-conducting state in the absence of external forces. Further, the MEMS switch may include a first electrode coupled to the substrate and positioned on the first side of the actuator to generate a first actuation force to pull the actuator towards the conduction state. The MEMS switch may also include a second electrode coupled to the substrate and positioned on the second side of the actuator to generate a second actuation force to pull the actuator towards the non-conducting state. In a non-limiting example, the actuator may be a movable beam, such as a cantilever beam.

In some embodiments, the wireless actuator circuit is configured to actuate (i.e., enable and/or disable) receiver coils with an actuation time of less than about 1 μs. In a particular embodiment, the actuation time for the receiver coils may be equal to about 100 ns. Further, the wireless actuator circuit is relatively less prone to noise, interference, and packet drops or failures. Additionally, a size of the wireless actuator circuit may be small enough such that the wireless actuator circuit may be accommodated in an existing MRI system. In particular, the size of the actuator circuit may be such that at least a portion of the wireless actuator circuit may be disposed along with the receiver coils with minimal adjustment in the receiver coils.

Figure 1:
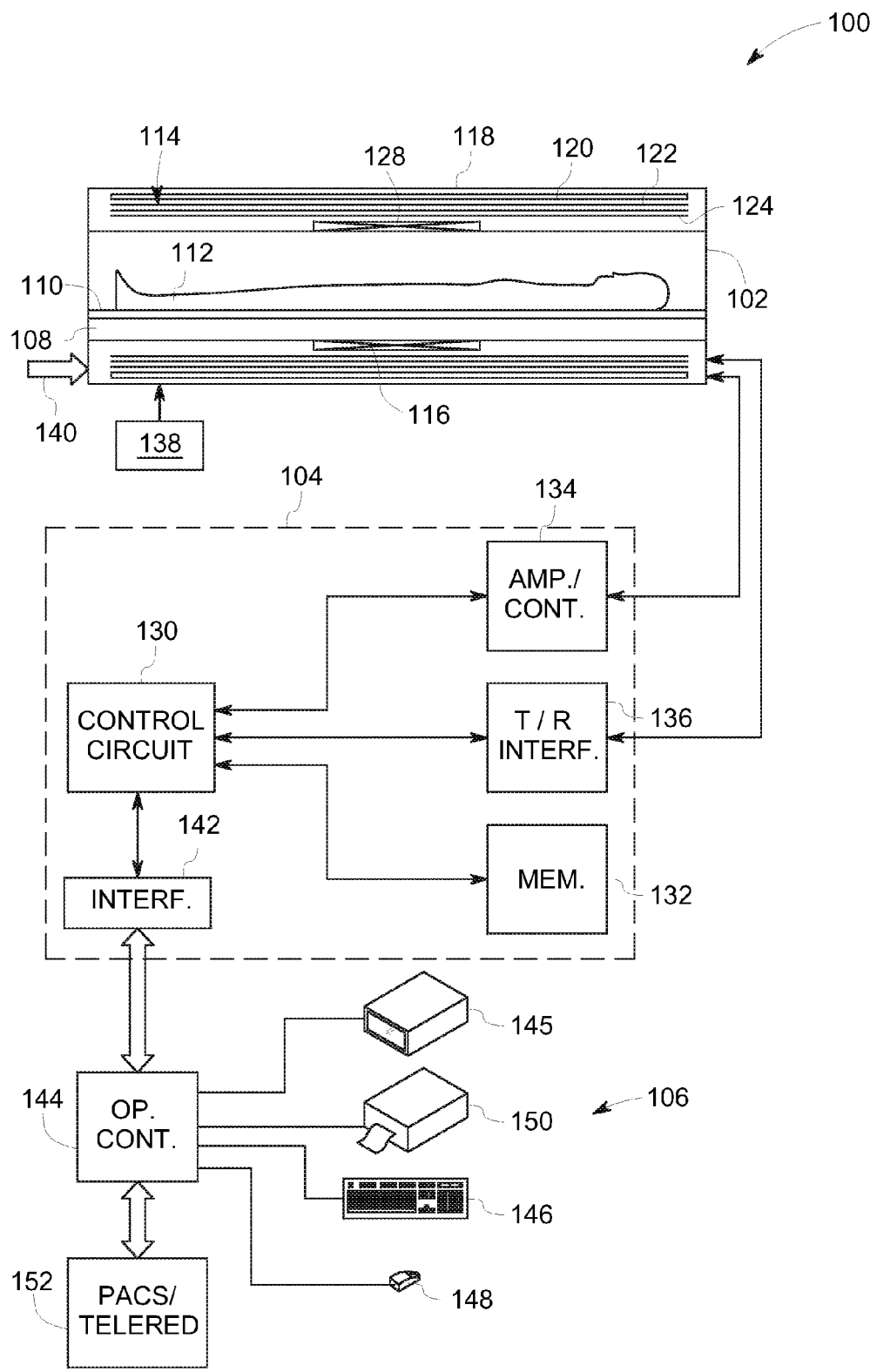
FIG. 1 is a schematic representation of a magnetic resonance imaging system employing a wireless actuator circuit, in accordance with aspects of the present specification.

Turning now to FIG. 1, a medical imaging system may include a magnetic resonance imaging (MRI) system 100. The MRI system 100 is illustrated diagrammatically as including a scanner 102, scanner control circuitry 104 and system control circuitry 106. While the MRI system 100 may include any suitable MRI scanner or detector, in the illustrated embodiment the system includes a full body scanner including a patient bore 108 into which a table 110 may be positioned to place the patient 112 in a desirable position for scanning The scanner 102 may be of any suitable rating, including scanners varying from 0.5 Tesla ratings to 3.0 Tesla ratings and above.

In certain embodiments, the scanner 102 includes transmitter coils generally represented by reference numeral 114 for producing controlled magnetic fields and/or generating radio-frequency (RF) excitation pulses. Further, the scanner 102 includes receiver coils, generally represented by reference numeral 116. The receiver coils 116 may represent a single receiver coil, a plurality of receiver coils, or an array of receiver coils. The receiver coils 116 are used for detecting emissions from gyromagnetic material within the patient 112 in response to the magnetic fields or RF excitation pulses of the transmitter coils 114. In the diagrammatical view of FIG. 1, a primary magnetic coil 118 may be provided for generating a primary magnetic field generally aligned with the patient bore 108. Further, the series of gradient coils 120, 122 and 124 may be grouped in a coil assembly for generating controlled magnetic gradient fields during examination sequences. Moreover, a RF coil 128 may be provided for generating radio frequency pulses for exciting the gyromagnetic material. In some embodiments, the RF coil 128 may also serve as the receiver coils 116. Thus, the RF coil 128 may be coupled with driving and receiving circuitry in passive and active modes of the MRI system 100 for receiving emissions from the gyromagnetic material and for applying RF excitation pulses, respectively. Alternatively, various configurations of the receiver coils 116 may be provided separate from the RF coil 128. Such coil configurations may include structures specifically adapted for target anatomies, such as head coil assemblies, and so forth. Moreover, receiver coils 116 may be provided in any suitable physical configuration, including phased array coils, and so forth.

Further, the gradient coils 120, 122 and 124 may be configured to serve to generate precisely controlled magnetic fields, the strength of which vary over a predefined field of view, typically with positive and negative polarity. When each coil is energized with known electric current, the resulting magnetic field gradient is superimposed over the primary field and produces a desirably linear variation in the z-axis component of the magnetic field strength across the field of view. It may be noted that the field varies linearly in one direction, but is homogenous in the other two directions. The three gradient coils 120, 122 and 124 have mutually orthogonal axes for the direction of their variation, enabling a linear field gradient to be imposed in an arbitrary direction with an appropriate combination of the three gradient coils 120, 122 and 124. The pulsed gradient fields perform various functions integral to the imaging process. Some of these functions are slice selection, frequency encoding and phase encoding. These functions may be applied along the x-axis, y-axis and z-axis of the original coordinate system or along other axes determined by combinations of pulsed currents applied to the individual field coils.

In some embodiments, the gradient coils 120, 122 and 124 may have different physical configurations adapted to their function in the MRI system 100. It may be noted that the various gradient coils 120, 122 and 124 may include conductive wires, bars or plates that are wound or cut to form a coil structure that generates a gradient field upon application of control pulses. The placement of the coils within an assembly of the gradient coils 120, 122 and 124 may be achieved in several different orders. In one embodiment, a z-axis coil may be positioned at an innermost location, and may be formed generally as a solenoid-like structure that has relatively little impact on the RF magnetic field. Thus, in the illustrated embodiment, gradient coil 124 is a z-axis solenoid coil, while coils 120 and 122 are y-axis and x-axis coils respectively.

Moreover, in certain embodiments, the transmitter coils 114 and the receiver coils 116 of the scanner 102 may be controlled by external circuitry to generate desirable fields and pulses, and read signals from the gyromagnetic material in a controlled manner. It may be noted, when the material, typically bound in tissues of the patient, such as the patient 112, is subjected to the primary magnetic field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, an RF frequency pulse is generated at or near the Larmor frequency of the material of interest, resulting in rotation of the net aligned moment to produce a net transverse magnetic moment. This transverse magnetic moment precesses around the main magnetic field direction, emitting RF signals that are detected by the scanner 102 and processed for reconstruction of the desirable image.

In some embodiments, a slice select gradient may be used to identify a slab of tissue or anatomy to be imaged in the patient. The slice select gradient field may be applied simultaneously with a frequency selective RF pulse to excite a known volume of spins within a desirable slice that precess at the same frequency. The slice thickness is determined by the bandwidth of the RF pulse and the gradient strength across the field of view. Further, in same or different embodiments, a frequency encoding gradient, also referred to as a readout gradient, may be usually applied in a direction perpendicular to the slice select gradient. In general, the frequency encoding gradient is applied before and during the formation of the magnetic resonance (MR) echo signal resulting from the RF excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding. Additionally, a phase encode gradient may be generally applied before the readout gradient and after the slice select gradient. Localization of spins in the gyromagnetic material in the phase encode direction may be accomplished by sequentially inducing variations in phase of the precessing protons of the material using slightly different gradient amplitudes that are sequentially applied during the data acquisition sequence. The phase encode gradient permits phase differences to be created among the spins of the material in accordance with their position in the phase encode direction.

Further, the coils of the scanner 102 are controlled by scanner control circuitry 104 to generate the desirable magnetic field and RF pulses. In the diagrammatical view of FIG. 1, the scanner control circuitry 104 includes a control circuit 130 for commanding the pulse sequences employed during the examinations, and for processing received signals. The control circuit 130 may include any suitable programmable logic device, such as a central processing unit (CPU) or a digital signal processor of a general purpose or application-specific computer. Also, the scanner control circuitry 104 may further include memory circuitry 132, such as volatile and non-volatile memory devices for storing physical and logical axis configuration parameters, examination pulse sequence descriptions, acquired image data, programming routines, and so forth, used during the examination sequences implemented by the scanner. Additionally, the scanner control circuitry 104 may include interface components 142 for exchanging configuration and image data with the system control circuitry 106. It should be noted that, while in the present description reference is made to a horizontal cylindrical bore imaging system employing a superconducting primary field magnet assembly, the present specification may be applied to various other configurations, such as scanners employing vertical fields generated by superconducting magnets, permanent magnets, electromagnets or combinations of thereof.

In addition, interface between the control circuit 130 and the coils of the scanner 102 may be managed by amplification and control circuitry 134 and by transmit/receive (T/R) circuitry 136. The amplification and control circuitry 134 includes amplifiers for each gradient field coil to supply drive current to the field coils in response to control signals from control circuit 130. Further, the transmit/receive (T/R) circuitry 136 includes additional amplification circuitry for driving the RF coil 128. Moreover, it may be noted that the RF coil 128 serves to emit the RF excitation pulses as well as to receive MR signals. Further, the T/R circuitry 136 may typically include a switching device for toggling the RF coil 128 between an active or transmitting mode, and a passive or receiving mode.

In some embodiments, the receiver coils 116 may include a frequency tuning component (not shown in FIG. 1). By way of example, the frequency tuning component may be configured to modify the frequency of the receiver coils 116 to tune the receiver coils 116 to a desirable frequency or a frequency range. In one example, the frequency tuning component may include one or more switches. In same or different example, the switches of the frequency tuning component may only be switched to adjust the frequency and impedance of the receiver coils 116. Moreover, the frequency and impedance of the receiver coils 116 may be adjusted when the receiver coils 116 is switching from measuring a first nucleus, such as hydrogen ($^1$H), to measuring a second nucleus, such as carbon ($^{13}$C), or vice versa. The switches of the frequency tuning component may be any suitable switch (e.g., a single pole single throw switch) having a low on-resistance and low capacitance for fast switching. In one embodiment, micro electromechanical system (MEMS) switches may be utilized for one or more of the switches of the frequency tuning component as the MEMS switches may be configured to provide a desirable low on-resistance, low parasitic capacitance as well as the ability to function suitably in the environment of the MRI system 100. The switches of the frequency tuning component may have a relatively lower switching frequency in comparison to the switching frequency of the MEMS switch 138.

Further, the receiver coils 116 may be operatively coupled to a MEMS switch 138 configured to activate and deactivate the receiver coils 116 as desirable during image acquisition. In one example, the MEMS switch 138 may be a single switch. In another example, the MEMS switch 138 may represent a plurality of MEMS switches operating in tandem to activate and deactivate the receiver coils 116. In certain embodiments, the MEMS switch 138 may be controlled by the scanner control circuitry 104 or the system control circuitry 106 of the MRI system 100 based on, for example, the instructions of the user. In one example, the MEMS switch 138, when open, may be configured to deactivate the receiver coils 116 to prevent damage to the receiver coils and/or injury to the patient 112 when the transmitter coils 114 are transmitting. As such, it should be appreciated that the MEMS switch 138 may be transitioned between open and closed states hundreds of times per second during the course of image acquisition. Also, in some embodiments, the wireless actuation of the MEMS switch 138 may be carried out using a wireless actuator circuit (not shown in FIG. 1) configured to actuate the MEMS switch 138. Further, the wireless actuator circuit includes a transmitter portion and a receiver portion. In some embodiments, the wireless MEMS switch actuation may be based on modulation of a wired transistor-transistor logic (TTL) control signal into a wireless on-off keying (OOK) signal by the transmitter portion and de-modulation of the wireless OOK signal back to the wired TTL control signal by the receiver portion. Further, the wireless actuation of the MEMS switch 138 includes providing the output of the receiver portion of the wireless actuator circuit to the MEMS switch 138 to actuate the MEMS switch to open or close.

In embodiments where the plurality of MEMS switches are employed, a determined bit sequence per MEMS switch 138 of the plurality of MEMS switches may be used by the transmitter portion of the wireless actuator circuit. The determined bit sequences for each of the plurality of MEMS switches may be modified by the receiver portion of the wireless actuator circuit. Non-limiting examples of the bit sequences may include a 3 bit sequence, a 4 bit sequence, and the like. Further, a tap delay line may be used at the receiver portion while receiving the bit sequences. Moreover, another delay line may be used by the receiver portion to compare the output of the tap delay line with a pre-programmed bit sequence to determine whether the MEMS switch 138 needs to be actuated. By way of example, if the output from the tap delay line is similar to the pre-programmed bit sequence, the MEMS switch 138 may be actuated. Moreover, output of the tap delay lines may be timed such that the output of the tap delay lines is similar to a determined tap sequence. On the transmitter portion, the binary signal may be modulated to provide a modified bit sequence. The MEMS switch 138 may be actuated to activate the receiver coils 116 when the binary signal matches the modified bit sequence. Alternatively, or additionally, in case of the plurality of MEMS switches 138, in some embodiments, each switch of the plurality of MEMS switches may be configured to be activated at a determined frequency. In these embodiments, frequencies that are relatively less noisy as compared to the surrounding environment may be used for activating the MEMS switches. In some embodiments, where the plurality of MEMS switches are employed, the plurality of MEMS switches may be actuated using a determined bit pattern, determined frequency, or both.

Furthermore, in some embodiments, the MEMS switch 138 and/or one or more switches of the frequency tuning component may include a MEMS switch described in U.S. application Ser. No. 11/961,737, entitled, "MEMS MICROSWITCH HAVING A DUAL ACTUATOR AND SHARED GATE," which is incorporated by reference herein in its entirety for all purposes. In certain other embodiments, the MEMS switch 138 and/or one or more switches of the frequency tuning component may include a MEMS switch described in U.S. Pat. No. 8,054,147, entitled, "HIGH VOLTAGE SWITCH AND METHOD OF MAKING," which is incorporated by reference herein in its entirety for all purposes. Additionally, in other embodiments, the MEMS switch 138 and/or one or more switches of the frequency tuning component may include a MEMS switch described in U.S. Pat. No. 7,928,333, entitled, "SWITCH STRUCTURES," described in U.S. Pat. No. 7,692,519, entitled, "MEMS SWITCH WITH IMPROVED STAND-OFF VOLTAGE CONTROL," described in U.S. Pat. No. 7,609,1130, entitled, "MEMS MICROSWITCH HAVING A CONDUCTIVE MECHANICAL STOP," or described in U.S. Pat. No. 7,605,1446, entitled, "SEALED WAFER PACKAGING OF MICROELECTROMECHANICAL SYSTEMS," which are all incorporated by reference herein in their entirety for all purposes.

In the illustrated embodiment, a power supply, denoted generally by reference numeral 140 in FIG. 1, is provided for energizing the primary magnetic coil 118. Moreover, the system control circuitry 106 may include a wide range of devices for facilitating interface between an operator or radiologist and the scanner 102 via the scanner control circuitry 104. In the illustrated embodiment, for example, an operator controller 144 is provided in the form of a computer workstation employing a general purpose or application-specific computer. The workstation may typically include memory circuitry for storing examination pulse sequence descriptions, examination protocols, user and patient data, image data, both raw and processed, and so forth. Further, the workstation may also include various interface and peripheral drivers for receiving and exchanging data with local and remote devices. In the illustrated embodiment, such devices include a conventional computer keyboard 146 and an alternative input device such as a mouse 148. A printer 150 may be provided for generating hard copy output of documents and images reconstructed from the acquired data. Moreover, a computer monitor 154 may be provided for facilitating operator interface. In addition, the MRI system 100 may include various local and remote image access and examination control devices, represented generally by reference numeral 152 in FIG. 1. Such devices may include picture archiving and communication systems (PACS), teleradiology systems, and the like.

Figure 2:
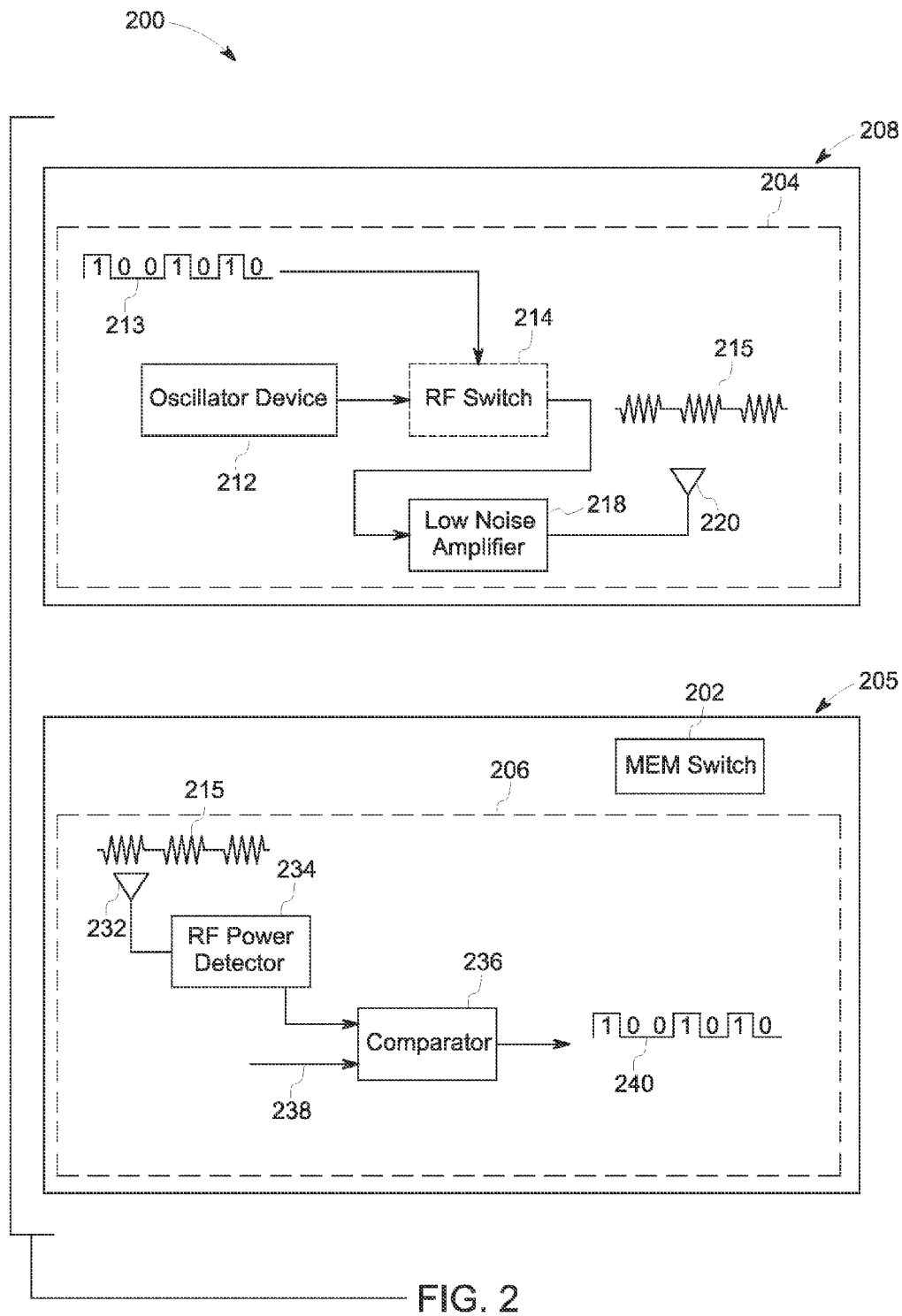
FIG. 2 is a schematic representation of an exemplary wireless actuator circuit, in accordance with aspects of the present specification.

FIG. 2 illustrates a diagrammatical representation of a wireless actuator circuit 200 configured to operate a MEMS switch 202. As illustrated, the wireless actuator circuit 200 primarily includes two portions, namely (1) a transmitter portion 204, and (2) a receiver portion 206. Further, the transmitter portion 204 of the wireless actuator circuit 200 may be disposed in system control circuitry or scanner control circuitry, generally represented by reference numeral 208, of a MRI system (not shown in FIG. 2). In some embodiments, the scanner control circuitry 208 may be similar to the scanner control circuitry 104 of FIG. 1, and the system control circuitry may be similar to the system control circuitry 106 of FIG. 1.

In certain embodiments, the receiver portion 206 of the wireless actuator circuit 200 may be disposed in a receiver coil assembly 205 of a MRI system (not shown in FIG. 2). The receiver coil assembly 205 may include receiver coils, such as the receiver coils 116 of FIG. 1. Optionally, the receiver coil assembly 205 may include other coils, such as the gradient coils 120, 122 and 124 of FIG. 1. Further, in the illustrated embodiment, the receiver portion 206 of the wireless actuator circuit 200 may be operatively coupled to the receiver coils. In one embodiment, the receiver portion 206 may be physically disposed on the receiver coils. In another embodiment, the receiver portion 206 may be disposed in a separate unit other than the receiver coils and in operative association with the receiver coils. Further, the MEMS switch 202 may be disposed in physical proximity and operative association with the receiver coils and the receiver portion 206.

In certain embodiments, the transmitter portion 204 of the wireless actuator circuit 200 includes a oscillator device 212 configured to generate a signal at a determined frequency. Non-limiting examples of the oscillator device may include a voltage controller oscillator (VCO), a crystal oscillator, or both. In one embodiment where the oscillator device is the VCO, the signal having the determined frequency may be generated in response to an applied control signal 213, where the control signal 213 may be provided by the scanner control circuitry 208. It may be noted that the illustrated control signal 213 is for illustrative purposes and other variations of the control signals are envisioned. In one example, the determined frequency may be a frequency that is an approved frequency as per international standards. In one example, the determined frequency may have a value within an industrial, scientific and medical (ISM) band. In a specific example, the determined frequency may be about 2.4 GHz. It may be noted that frequencies and their corresponding harmonics that may interfere with operation of the MRI system may not be used as the determined frequency. Further, the oscillator device 212 may be operatively coupled to a first antenna 220. In the illustrated embodiment, the oscillator device 212 is operatively coupled to the first antenna 220 using a RF switch 214. The RF switch 214 is configured to receive an output, which is the signal at the determined frequency, from the oscillator device 212. Further, the oscillator device 212 and/or the RF switch 214 are configured to produce a modulated signal 215 in response to the control signal 213. Moreover, when the RF switch 214 is on, the output from the oscillator device 212 is passed to the first antenna 220. Whereas, when the RF switch is off, the output from the oscillator device 212 may not be passed to the first antenna 220. Although not illustrated, in some embodiments, the RF switch 214 may not be employed. In an example embodiment where the RF switch 214 is not employed, the oscillator device 212 may be turned on and off at a determined frequency to provide the modulated signal 215 to the first antenna 220.

In one embodiment, the modulated signal 215 is an OOK wireless signal. In one embodiment, the RF switch 214 may be controlled by a TTL signal to modulate the control signal 213 at a determined frequency to generate the OOK wireless signal. In one embodiment, the RF switch 214 may be configured to modulate a 2.4 GHz CW into a corresponding OOK wireless signal. In one embodiment, the RF switch 214 may be a high speed RF switch. By way of example, the switching latency of the RF switch 214 may be less than about 10 ns. In one example, the oscillator device 212 may be configured to feed the high speed RF switch 214 with a 2.4 GHz ISM band continuous wave (CW). The modulated signal 215 is transmitted from the transmitter portion 204 to the receiver portion 206 using a first antenna 220 of the transmitter portion 204 of the wireless actuator circuit 200.

In some embodiments, the oscillator device 212 and/or the RF switch 214 may be operatively coupled to a low noise amplifier 218, and the low noise amplifier 218 in turn may be operatively coupled to the first antenna 220. In a non-limiting example, the first antenna 220 may be a chip antenna, a patch antenna, a coil antenna, or combinations thereof. In some embodiments, the output of the oscillator device 212 and/or the RF switch 214 may be fed to a low-noise amplifier 218 before being transmitted through the first antenna 220. Further, in one embodiment, the RF switch 214 may be controlled by a RF signal. In particular, the control signal 213 may be a RF signal.

Additionally, the receiver portion 206 of the wireless actuator circuit 200 includes a second antenna 232, an RF power detector 234 and a comparator 236. The second antenna 232 is configured to receive the modulated signal 215 from the transmitter portion 204. Further, the RF power detector 234 is configured to detect the modulated signal 215 received by the second antenna 232. The RF power detector 234 is configured to convert the modulated signal 215 into a corresponding voltage value. In one embodiment, the RF power detector 232 may have a high dynamic range. Further, the comparator 236 is configured to compare the converted voltage with a determined value 238 of a voltage threshold that may be fed to the comparator 236.

In instances where the converted value of a voltage is greater than the determined value 238 of the voltage, the comparator 236 may be configured to trigger a de-modulated control signal 240 to close the MEMS switch 202, thereby activating the receiver coils of the receiver coil assembly 205. In some embodiments, the de-modulated control signal 240 may be a wired transistor-transistor logic TTL control signal. Further, in instances where the converted value of the voltage is lower than the determined value 238 of the voltage, the comparator 236 triggers a de-modulated control signal 240 to open the MEMS switch 202, thereby deactivating the receiver coils. By way of example, the determined value 238 may be selected such that the converted voltage value may be greater than the pre-set value in the receiving mode of the MRI system, and the converted voltage value may be lower than the pre-set value in the transmitting mode of the MRI system. Hence, when the MRI system is in the transmitting mode, the receiver coils may be deactivated, and vice versa.

Further, although not illustrated, in some embodiments, a bandpass filter may be disposed between the antenna 232 and the RF power detector 234 to minimize noise and/or interference from other frequency bands. In one embodiment, the bandpass filter is a 2.4 GHz ISM bandpass filter to prevent any frequencies outside of the 2.4 GHz ISM band from reaching to the second antenna 232.

It may be noted that the transmitter portion 204 of the wireless actuator circuit 200 may be at a remote location relative to the MEMS switch 202. Further, it may be noted that in the illustrated embodiment of FIG. 2, the MEMS switch 202 is powered using the MR coil array. Alternatively, in other embodiments, the MEMS switch 202 may be powered using wireless inductive power.

Referring now to a specific non-limiting example, if the output of the RF power detector 234 exceeds the determined value 238 (for example, a determined voltage threshold), the corresponding output of the voltage comparator 236 may be set to a TTL logic '1' indicating the presence of the 2.4 GHz signal. Likewise, if the output of the RF power detector 234 is below the determined voltage threshold, the corresponding output of the voltage comparator 236 may be set to a TTL logic '0' indicating the absence of the 2.4 GHz signal.

Thus, the combination of the RF power detector 234 and the voltage comparator 236 is configured to de-modulate the modulated signal 215 (for example, the OOK wireless signal) into a 5V TTL control signal at the receiver portion 206 of the wireless actuator circuit 200. This de-modulated signal is used to control the MEMS switch 202 to activate the MEMS switch 202 when desirable. In instances of the TTL logic being 1, the MEMS switch 202 may be closed, whereas, in instances of the TTL logic being 0, the MEMS switch 202 may be caused to open.

In some embodiments, the signals for actuating the MEMS switch 202 may follow an OOK communications protocol. However, other communication protocols are also envisioned within the purview of the present specification. OOK is a communications protocol whereby the presence of a predefined signal indicates a logic '1' and a logic '0' otherwise.

Advantageously, the wireless actuator circuit 200 of the present specification is relatively less prone to noise, interference, and packet drops or failures. It may be noted that the RF power detector 234 is configured to detect an oscillator signal in a determined power level range as well as a determined dynamic range to at least partly filter out noise signals.

Figure 3:
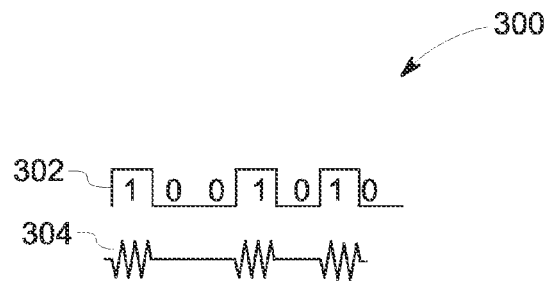
FIG. 3 is a graphical representation of a wired transistor-transistor logic (TTL) control signal and a corresponding on-off keying (OOK) signal, in accordance with aspects of the present specification.

FIG. 3 is a representation 300 of an example of an OOK communication protocol in the context of the present specification. In the illustrated example, a 5V TTL control signal 302 is used to generate a corresponding wireless OOK signal 304. In particular, the 5V TTL control signal 302 is modulated with a 2.4 GHz CW to obtain the corresponding OOK signal 304. At the receiver portion, the corresponding OOK signal 304 may be de-modulated to generate another control signal that is similar to the TTL signal 302.

Figure 4:
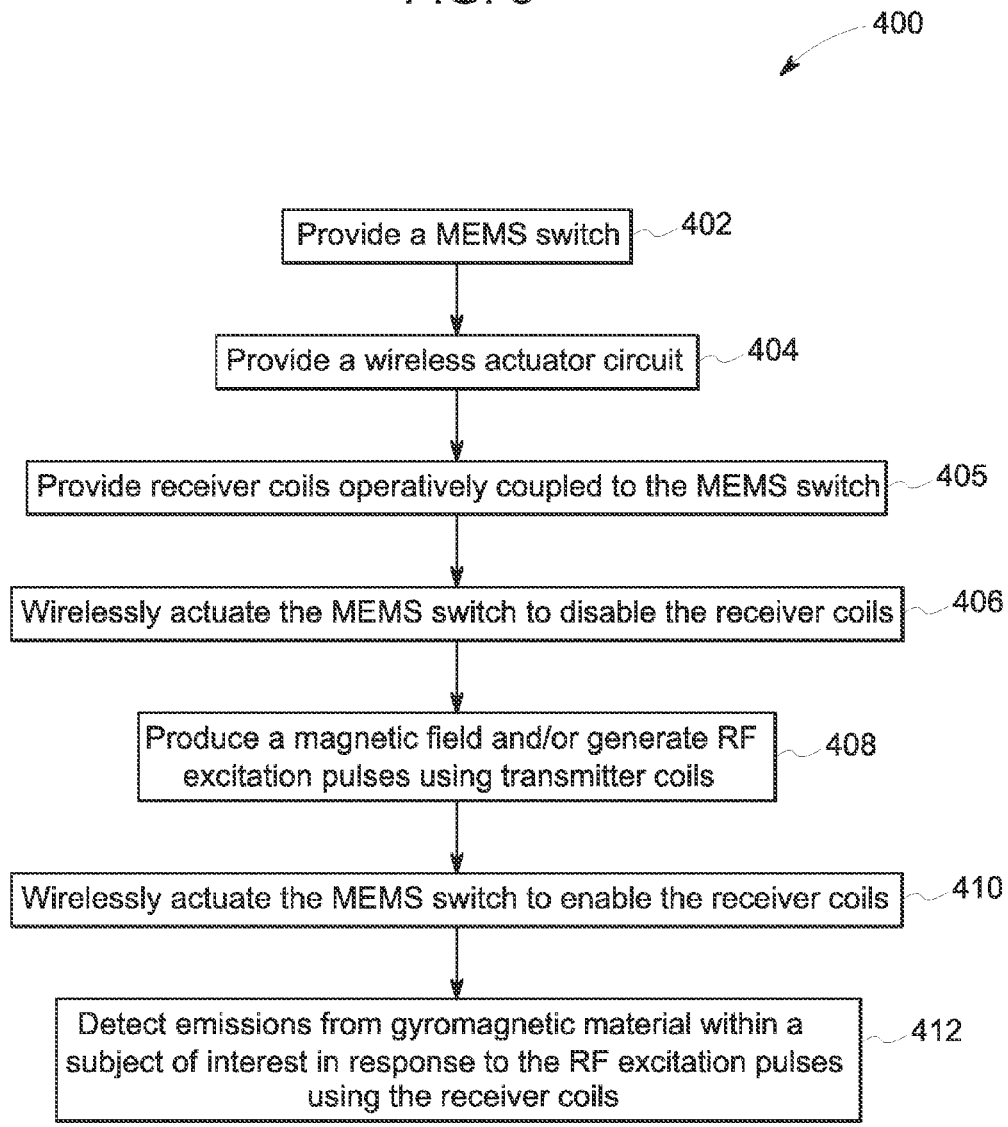
FIG. 4 is an exemplary method of image acquisition using a magnetic resonance imaging system employing a wireless actuator circuit, in accordance with aspects of the present specification.

FIG. 4 is an exemplary method 400 of imaging a subject of interest using a MRI system, such as the MRI system 100 of FIG. 1, having a wireless actuator circuit of the present specification. At block 402, a MEMS switch is provided. In some embodiments, the step of providing the MEMS switch may include operatively coupling the MEMS switch to receiver coils of the MRI system. An example of physical placement of the MEMS switch in the receiver coils will be described with reference to FIGS. 5A-5B and 6A-6B.

Next, at block 404, a wireless actuator circuit may be provided. The wireless actuator circuit includes a transmitter portion configured to modulate a wired control signal to a wireless signal. Further, the wireless actuator circuit includes a receiver portion configured to receive the wireless signal and de-modulate the wireless signal into the control signal. The step of providing the wireless actuator circuit may include the steps of (1) disposing the transmitter portion and the receiver portion of the wireless actuator circuit in the MRI system. Further, the step of providing the wireless actuator circuit may include the steps of operatively coupling the wireless actuator circuit to the MEMS switch. Moreover, the MEMS switch is configured to be wirelessly controlled using the wireless actuator circuit.

Also, at block 405, receiver coils operatively coupled and integrated with the MEMS switch are provided. The receiver coils and the MEMS switch are integrated so as to enable the receiver coil to be activated or deactivated using the MEMS switch.

Moreover, at block 406, the MEMS switch may be wirelessly actuated using the wireless actuator circuit to disable the receiver coils. In one embodiment, the wireless actuation of the MEMS switch may be based on a modulation of a wired TTL control signal into a wireless OOK signal in the transmitter portion of the wireless actuator circuit and de-modulating the wireless signal back to a wired TTL control signal by the receiver portion of the wireless actuator circuit. In addition, the wireless actuation of the MEMS switch may also include connecting the output of the receiver portion to the MEMS switch.

At block 408, magnetic fields and/or RF excitation pulses are generated using transmitter coils for exciting gyromagnetic material within an anatomy of the subject of interest being imaged. At block 410, the method includes wirelessly actuating the MEMS switch to enable the receiver coils. Advantageously, switching latencies may be less than about 1 micro second. Subsequently, at step 412, emissions from gyromagnetic material within the subject of interest in response to the RF excitation such pulses may be detected using the receiver coils.

In some embodiments, at block 406, the wireless actuation may employ a timing signal that is typically available in current implementations of MRI systems. The timing signal is configured to switch voltage levels, indicating the start of generation of RF excitation pulses at 408. Consequently, the MEMS switch is actuated to disable the receiver coils with this timing signal. Further, at the end of the RF excitation pulses, the timing signal may again switch the voltage levels. Moreover, the wireless actuator circuit may detect this change in the voltage levels and wirelessly actuate the MEMS switch to enable the receiver coils (block 410) and facilitate detection of emissions from the gyromagnetic material (block 412).

In some embodiments, it may be desirable to image more than one type of gyromagnetic nucleus, such as hydrogen ($^1$H) and carbon ($^{13}$C), in the subject of interest during magnetic resonance imaging. Furthermore, it may be desirable to use tunable receiver coils to analyze multiple gyromagnetic nuclei in the subject of interest. It should be appreciated that by utilizing multi-nuclear, tunable receiver coils, an MRI system may acquire data from either nucleus without waiting for a technician to remove and replace the receiver coils. As such, use of multi-nuclear, tunable receiver coils enables a measure of two or more nuclei in rapid succession, thereby enabling imaging of more than one nucleus for time-sensitive imaging applications (e.g., metabolic studies), for which swapping the receiver coils may be impractical.

One example of a tunable receiver coil includes a separate loop that when energized, can couple to the receiver coil and split the initial resonance frequency (e.g., the resonance frequency of $^{19}$F at approximately 120 MHz at 3 tesla (T)) such that a second nucleus may be measured (e.g., $^1$H at approximately 128 MHz). However, using a loop to split the resonance peak of the receiver coil may be limited to tuning the receiver coil over a relatively narrow range of frequencies. For example, the example described above may be effective for constructing a receiver coil that may be tuned to measure $^{19}$F at approximately 120 MHz (e.g., at a field strength of 3 T) and to measure $^1$H at approximately 128 MHz since the difference is only approximately 8 MHz. Further, for nuclei having greater difference between the resonance frequencies (e.g., $^1$H at approximately 128 MHz and $^{13}$C at approximately 116 MHz at 3 T), using a separate receiver coil may not provide the desirable frequency range for the tunable receiver coil.

In certain embodiments, the tunable receiver coils are capable of operating at more than one frequency, which allows the tunable receiver coils to measure at least two gyromagnetic nuclei (e.g., $^1$H and $^{13}$C) during an magnetic resonance imaging sequence. Also, in one embodiment, the wireless actuator circuit may be employed in a MRI system having a dual-frequency receiver coil for analyzing both $^1$H and $^{13}$C nuclei. Alternatively, in certain other embodiments, the MRI system may include one or more receiver coils capable of operating at more than two frequencies (e.g., 3, 4, or 5 frequencies) and/or capable of measuring other nuclei (e.g., $^{19}$F, $^{23}$Na, $^{114}$P, etc.). In some embodiments, the wireless actuator circuit may be used in such MRI systems that involve switching frequencies of receiver coils, for multi-nuclear spectroscopy. In case of tunable receiver coils, the various tunable receiver coils may be actuated using different bit patterns and/or different frequencies to enable imaging at different frequencies.

In one embodiment, each receiver coil of the one or more receiver coils may include a frequency tuning component configured to set one receiver coil to a first frequency to observe a first nucleus and another receiver coil to a second frequency to observe a second nucleus, and so on. Further, the one or more receiver coils may also include an impedance matching component configured to match an impedance of the receiver coil at the second frequency to an impedance of the receiver coil at the first frequency.

In some embodiments, the MEMS switch of the MRI system may not be powered using the MR coil array. In some of these embodiments, the MEMS switch may have a capacitor based design. In one embodiment, as the applied voltage to the MEMS switch builds up in an actuator of the MEMS switch (e.g., a cantilever beam), the switch closes, and vice versa. In certain embodiments, the transmitter portion of the wireless actuator circuit is configured to transmit RF signals to the receiver portion. Further, in some of these embodiments, the receiver portion includes a second antenna and a rectifying circuit. The rectifying circuit is configured to provide a direct current (DC) voltage in response to the received wireless actuation signal to activate the MEMS switch. In one embodiment, the transmitter portion may be configured to transmit radio frequency signals, which are captured by the antenna and converted to direct current voltage by the rectifying circuit. This voltage is applied to the MEMS switch to actuate the MEMS switch.

Figure 5A:
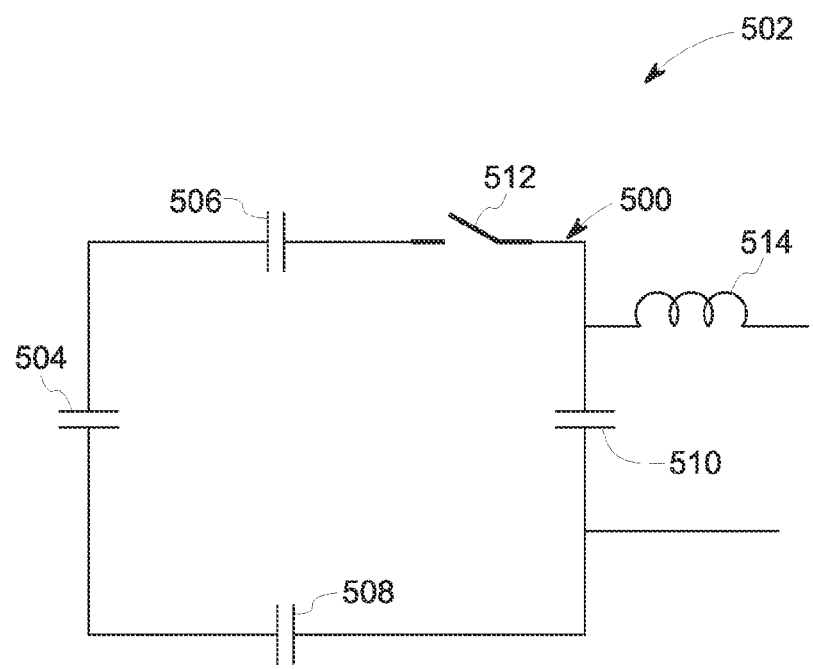
FIGS. 5A-5B are schematic representations of an exemplary circuit diagram for physical placement of a micro electromechanical system (MEMS) switch in a receiver coil, in accordance with aspects of the present specification.
Figure 5B:
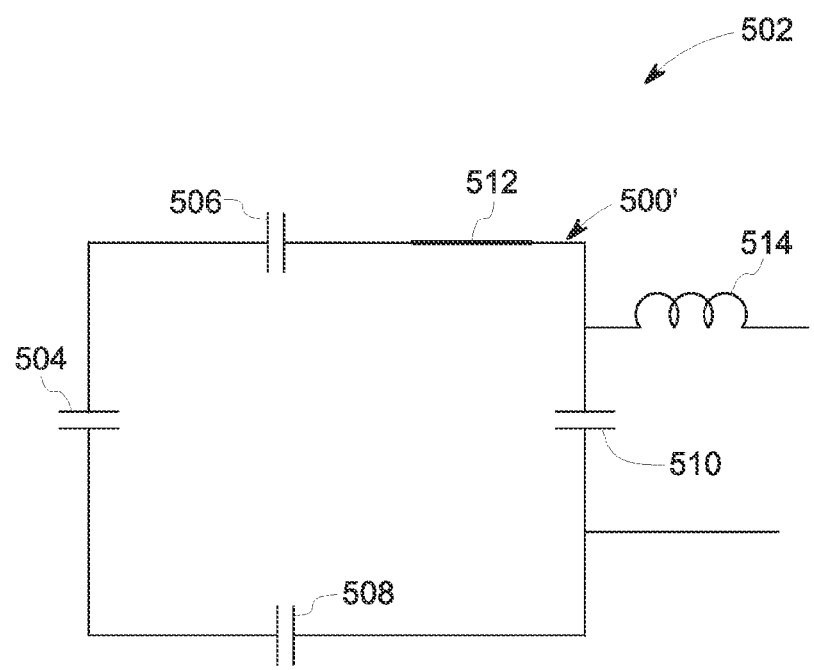

FIGS. 5A and 5B illustrate a coil portion 500 of a receiver coil 502 of a MRI system (not shown). The coil portion 500 includes capacitors 504, 506, 508, and 510. The capacitors 504, 506, 508, and 510 are configured to be activated to modify a frequency of the receiver coil 502. The coil portion 500 includes a MEMS switch 512 and an inductor 514. The MEMS switch 512 is operatively coupled to a wireless actuator circuit of the present specification. The wireless actuator circuit is configured to open and close the MEMS switch 512 based on the transmitting and receiving modes of the MRI system employing the actuator circuit and the MEMS switch 512. Further, as illustrated in FIG. 5A, the MEMS switch 512, when open, causes the electrical circuit of the coil portion 500 to break, thereby disabling the receiver coil, for example, during transmitting mode of the MRI system. Further, the MEMS switch 512, when open, deactivates the receiver coil 502 to prevent damage to the receiver coil 502 and/or injury to the patient in the transmitting mode of the MRI system. As such, it should be appreciated that the MEMS switch 512 may be switched open and closed hundreds of times per second during the course of an image data acquisition using the MRI system.

Further, as illustrated in FIG. 5B, the MEMS switch 512 of the coil portion 500', when closed, causes the electrical circuit of the coil portion 500' to be continuous, thereby allowing the receiver coils to be in receiving mode, hence enabling acquisition of image data.

FIGS. 6A-6B illustrate a coil portion 600 of a receiver coil 602. The coil portion 600 includes capacitors 604, 606, 608, and 610. The capacitors 604, 606, 608, and 610 are configured to be activated to modify a frequency of the receiver coil 602. Further, the receiver coil 602 includes a first inductor 612, and a second inductor 614, and a MEMS switch 616. The capacitor 606 and the second inductor 614 together form a de-tuning circuit 618. As illustrated in FIG. 6A, when the switch 618 is closed, both the capacitor 606 and the inductor 614 are operatively coupled to the receiver coil 602, thereby altering the inductance of the receiver coil 602. This change in the inductance of the receiver coil 602 de-tunes the receiver coil during the transmitting mode of the MRI system.

However, as illustrated in FIG. 6B, when the MEMS switch 616 of the coil portion 600' is open, only the capacitor 606 of the de-tuning circuit 618 is activated, and the inductor 614 is operatively decoupled from the de-tuning circuit 618. It may be noted that when the inductor 614 is operatively decoupled from the receiver coil 602, the receiver coil 602 is tuned to the Larmor frequency and configured to receive MR signals from a subject being imaged.

In the illustrated embodiment of FIG. 6B, the switch 616, when closed, deactivates the receiver coil 602 by de-tuning the receiver coil 602 away from the Larmor frequency to prevent damage to the receiver coil 602 and/or injury to the patient in the transmitting mode of the MRI system. As such, it should be appreciated that the MEMS switch 616 may be switched open and close hundreds of times per second during the course of an acquisition.

In addition, it may be noted that the MEMS switch 616 may be operatively coupled to a receiver coil of an MRI system in several different ways. Non-limiting examples of operatively coupling the MEMS switch 616 to the receiver coil may include disposing the MEMS switch in an outline of the receiver coil, disposed in copper windings of the MRI coil, formed as a part of a receiver circuit, and the like.

Example:

Transmitter and receiver portions of the wireless actuator circuit of the present application were constructed in a lab setting and tested for speed and accuracy. Further, the RF switch was turned on and off continuously with a signal generator clock at 1 MHz. FIG. 7 is a graphical representation 700 of an output of a comparator, represented generally by reference numeral 708, with respect to a RF switch clock signal 706. Further, abscissa 702 represents frequency, whereas ordinate 704 represents time. Rise and fall times were measured at 100 ns and 88 ns, respectively. The results of the demonstration show that design is able to meet the desirable 1 μs switching time required.

Advantageously, in addition to being wireless, the wireless actuator circuit is cost effective, and relatively small in size. Further, the wireless actuator circuit may be retro-fitted in existing MRI systems. In an example embodiment, the receiver portion of the design may be implemented on a board size of less than about 1 square inch or less. Moreover, the wireless actuator circuit is configured to enable and/or disable the receiver coils with an actuation time of less than about 1 μs.

One or more specific embodiments of the present specification are described herein. In an effort to provide a concise description of these embodiments, all features of an actual implementation may not be described in the specification. It should be appreciated that in the development of any such actual implementation, as in any engineering or design project, numerous implementation-specific decisions must be made to achieve the developer's specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

The invention claimed is:

1. A wireless actuator circuit configured to actuate a micro electromechanical system (MEMS) switch, comprising:
    a transmitter portion comprising:
        an oscillator device configured to generate a signal at a determined frequency;
        a first antenna operatively coupled to the oscillator device and configured to receive a modulated signal;
    a receiver portion operatively coupled to the transmitter portion, wherein the receiver portion comprises:
        a second antenna configured to receive the modulated signal from the transmitter portion;
        a radio frequency power detector configured to detect the modulated signal; and
        a comparator configured to produce a control signal in response to the modulated signal detected by the radio frequency power detector to toggle the MEMS switch.

2. The wireless actuator circuit of claim 1, further comprising a radio frequency switch configured to receive the signal from the oscillator device and convert the received signal into the modulated signal.

3. The wireless actuator circuit of claim 2, wherein the radio frequency switch is a high speed radio frequency switch.

4. The wireless actuator circuit of claim 1, further comprising a low noise amplifier operatively coupled to the oscillator device, the first antenna, or both.

5. The wireless actuator circuit of claim 1, further comprising a low noise amplifier operatively coupled to the second antenna, the radio frequency power detector, or both.

6. The wireless actuator circuit of claim 1, wherein at least one of the first antenna, the second antenna, or both is a chip antenna, a patch antenna, a coil antenna, or combinations thereof.

7. A magnetic resonance imaging system, comprising:
    one or more receiver coils;
    a MEMS switch operatively coupled to the one or more receiver coils;
    a wireless actuator circuit configured to actuate the MEMS switch, wherein the wireless actuator circuit comprises:
        a transmitter portion, comprising:
            a voltage controlled oscillator configured to generate a signal at a determined frequency;
            a radio frequency switch operatively coupled to the voltage controlled oscillator, wherein the radio frequency switch is configured to receive the signal from the voltage controlled oscillator, and wherein the radio frequency switch is configured to convert the signal received from the voltage controlled oscillator into a modulated signal;
            a first antenna operatively coupled to the radio frequency switch, wherein the first antenna is configured to receive the modulated signal from the radio frequency switch;
        a receiver portion operatively coupled to the transmitter portion, wherein the receiver portion comprises:
            a second antenna configured to receive the modulated signal from the transmitter portion;
            a radio frequency power detector configured to detect the modulated signal received by the second antenna; and
            a comparator configured to produce a control signal in response to the modulated signal detected by the radio frequency power detetctor to toggle the MEMS switch.

8. The magnetic resonance imaging system of claim 7, comprising a plurality of MEMS switches.

9. The magnetic resonance imaging system of claim 8, wherein each MEMS switch of the plurality of MEMS switches is operatively coupled to the wireless actuator circuit.

10. The magnetic resonance imaging system of claim 8, wherein each MEMS switch of the plurality of MEMS switches is configured to be actuated by the wireless actuator circuit using a determined bit sequence, a determined frequency, or both.

11. The magnetic resonance imaging system of claim 7, wherein the receiver portion of the wireless actuator circuit is disposed in the one or more receiver coils.

12. The magnetic resonance imaging system of claim 7, wherein a coil portion of a receiver coil of the one or more receiver coils comprises a plurality of capacitors operatively coupled to the MEMS switch.

13. The magnetic resonance imaging system of claim 12, wherein the coil portion of the receiver coil of the one or more receiver coils further comprises a de-tuning circuit operatively coupled to the MEMS switch.

14. The magnetic resonance imaging system of claim 13, wherein the de-tuning circuit comprises an inductor operatively coupled to at least one capacitor of the plurality of capacitors.

15. The magnetic resonance imaging system of claim 7, wherein the magnetic resonance imaging system is a multi-nuclear magnetic resonance imaging system.

16. The magnetic resonance imaging system of claim 15, wherein a first nucleus is hydrogen ($^1H$) and a second nucleus is carbon ($^{13}C$).

17. The magnetic resonance imaging system of claim 16, further comprising scanner control circuitry configured to control a frequency tuning component and an impedance matching component of each receiver coil of the one or more receiver coils.

18. The magnetic resonance imaging system of claim 17, further comprising system control circuitry configured to receive data from the one or more receiver coils and generate one or more magnetic resonance imaging images based, at least in part, on the received data.

19. The magnetic resonance imaging system of claim 18, wherein the transmitter portion is disposed in the system control circuitry or the scanner control circuitry.

20. A method for imaging a subject, comprising:
    providing a MEMS switch;
    providing a wireless actuator circuit;
    providing receiver coils operatively coupled to the MEMS switch;
    wirelessly actuating the MEMS switch to disable the receiver coils;
    producing a magnetic field, generating radio frequency excitation pulses, or both using transmitter coils;

wirelessly actuating the MEMS switch to enable the receiver coils; and detecting emissions from gyromagnetic material within the subject in response to the radio frequency excitation pulses using the receiver coils.

21. The method of claim 20, wherein a switching latency of the MEMS switch is less than about 1 μs.

22. The method of claim 20, wherein the step of wirelessly actuating the MEMS switch to disable the receiver coils comprises modulating a wired transistor-transistor logic (TTL) control signal to generate a corresponding wireless on-off keying (OOK) signal.

23. The method of claim 22, wherein the step of wirelessly actuating the MEMS switch to enable the receiver coils further comprises:

de-modulating the wireless signal back to a wired TTL control signal; and providing the de-modulated TTL control signal to the MEMS switch.

\* \* \* \* \*